US005793240A

United States Patent [19]

Kuwano et al.

[11] Patent Number: 5,793,240
[45] Date of Patent: Aug. 11, 1998

[54] METHOD AND CIRCUIT FOR THERMAL ASPERITY COMPENSATION IN A DATA CHANNEL

[75] Inventors: Hiro Kuwano; Motomu Hashizume, both of Plano, Tex.

[73] Assignee: Texas Instruments Incorporated, Dallas, Tex.

[21] Appl. No.: 812,678

[22] Filed: Mar. 6, 1997

[51] Int. Cl.[6] ............................................. H03K 5/00
[52] U.S. Cl. ........................ 327/310; 327/314; 327/316
[58] Field of Search ................................. 327/310, 314, 327/316; 360/46, 67, 39, 59

[56] References Cited

U.S. PATENT DOCUMENTS

| 4,914,398 | 4/1990 | Jove | 328/167 |
|---|---|---|---|
| 5,057,785 | 10/1991 | Chung et al. | 328/162 |
| 5,377,054 | 12/1994 | Yamaguchi et al. | 360/39 |
| 5,559,460 | 9/1996 | Cunningham | 327/179 |
| 5,715,110 | 2/1998 | Nishiyama et al. | 360/67 |

*Primary Examiner*—Vu A. Le
*Attorney, Agent, or Firm*—Bret J. Petersen; W. Daniel Swayze, Jr.; Richard L. Donaldson

[57] ABSTRACT

A circuit suppresses an additive transient disturbance in an input signal. A main signal path transmits the input signal, and a switchable signal path is switchable into the main signal path during a portion of the disturbance. A positive envelope detector and a negative envelope detector detects, respectively, a positive envelope signal and a negative envelope signal. In response to these signals, positive and negative envelope signals are subtracted from the main signal path only during the portion of the disturbance.

9 Claims, 3 Drawing Sheets

METHOD AND CIRCUIT FOR THERMAL ASPERITY COMPENSATION IN A DATA CHANNEL

TECHNICAL FIELD OF THE INVENTION

This invention relates to a method and circuitry for detecting and removing additive transient disturbances in a data channel, and more particularly, to method and circuitry for suppressing electrical transients caused by temperature change in a magneto-resistive (MR) sensor due to physical contact of the sensor with the recording surface of a rotating magnetic disk.

BACKGROUND OF THE INVENTION

Disturbances which occur in a data channel can be categorized as either additive or multiplicative. An undesirable additive disturbances signal is simply added to the information (data) signal. An undesirable multiplicative disturbances or data density change causes a modulation of the data signal.

In the data channel where the signal sensing transducers are magneto-resistive (MR) sensors exposed to the air in the air bearing surface of a slider assembly and a rotating magnetic disk, additive disturbances can occur due to physical frictional contact of the sensors(s) with the moving recording surface of the disk. The disturbances result from the friction-generated elevated temperature (up to 120° C.) at the contact spot. This produces a small yet sudden increase in temperature of the MR sensor; for example in the order of 1° C. averaged over the entire sensor within about 50 to 100 nanoseconds. Due to the nonzero temperature coefficient of resistance of the MR sensor (approximately 0.003/°C. for permalloy), the sensor resistance will increase with this sudden temperature rise. The heat conducted into the MR sensor from the hot spot will diffuse slowly to the environment of the sensor, causing the resistance increase to decay slowly to the original value. Typically, a drop to about 30% of the thermally induced resistance change will occur in 1.5 to 5 microseconds (µs).

Such a combination of signals and disturbances cause many problems with signal detection in the data channel. The automatic gain control (AGC) circuit in the channel may fade out quickly during the transient and recover only slowly. Even if the AGC circuit were to accommodate the disturbed signal, the thermal transient would still result in a peak shift, for example, the data signal is differentiated for peak detection, and as a result of this the thermal transient will also be differentiated. This leads to an extra zero crossing and a shift of the zero crossing level after the thermal transient.

FIG. 1 illustrates the magnetic signal or the information signal 2 to be detected by the MR sensor without the disturbance.

In FIG. 2, a disturbance signal 4 is illustrated without the information signal 2, which may be caused by the physical frictional contact with the sensor with the moving recording surface of the disk.

FIG. 3 illustrates two signals, namely the disturbance signal plus the information signal to form the input signal 6 detected by the magneto-resistive effect from the MR sensor and additive combined.

U.S. Pat. No. 3,566,281 discloses positive and negative peak detection, which are offset by a constant voltage and averaged and subtracted from the delayed input signal.

U.S. Pat. No. 3,473,131 and 4,356,389 are other patents which do not solve the problems of additive disturbances.

U.S. Pat. No. 4,914,398 discloses positive and negative envelope detectors and a buffer which interconnects the detectors with a nonlinear signal-adaptive filter. However, this patent introduces phase distortion which is caused by the low pass filter. The disturbance as illustrated in FIG. 3 tends to be an abrupt change, and the filter response makes it difficult to respond to these abrupt changes. In consequence, it is difficult to detect high frequency responses. Thus, it is difficult to maintain group delay $\Delta Phase/\Delta frequency$ due to the phase distortion and ripple rejection simultaneously, inspite of the adaptive low pass filter.

SUMMARY OF THE INVENTION

A circuit and method are disclosed for suppressing an additive transient disturbance in a data channel, without introducing phase distortion. Furthermore, the method and circuit of the present invention simplifies the circuit for removing the disturbance by only employing positive and negative peak detectors with a switch to quickly switch in and switch out the peak detectors at appropriate or predetermined times to remove the disturbance without affecting the high frequency data signal.

Furthermore, the method and circuit of the present invention eliminates tracking forward, by eliminating the peak detection throughout the detection of the data signals, regardless of whether or not a disturbance is occurring.

The method and circuit of the present invention employs an open loop, for example an open forward loop of a main signal path eliminating the errors caused by adding peaks of a closed loop.

More specifically, a positive and negative peak detector is successfully switched in and out by a switch to provide a intermittent feedback circuit. During the time period that the positive and negative peak detectors are switched in, a positive envelope generator and a negative envelope generator generates a positive and negative envelope, respectively, to follow the data signals from the MR sensor.

DETAILED DESCRIPTION OF THE INVENTION

Figure 1:
FIG. 1 illustrates an input data signal.
Figure 2:
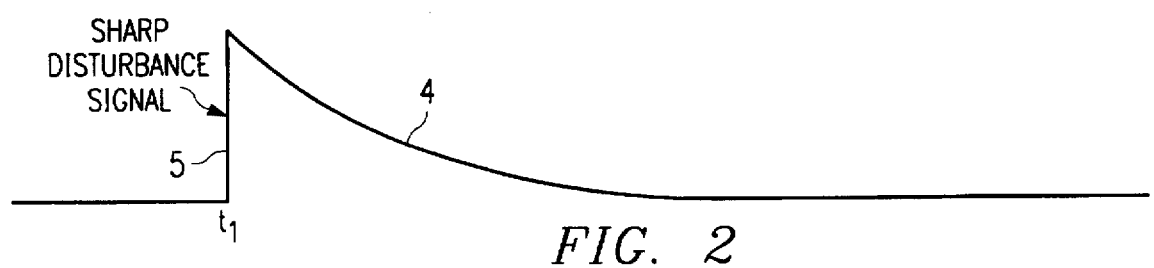
FIG. 2, illustrates an input disturbance signal.
Figure 3:
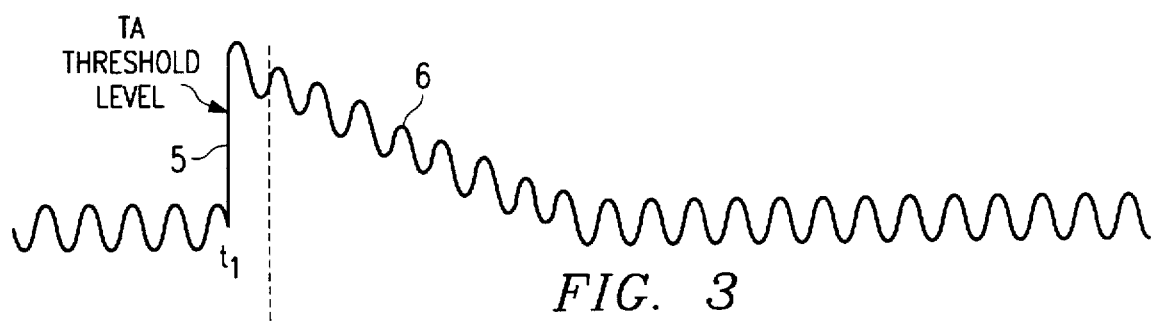
FIG. 3 illustrates the combined input data signal with the input disturbance signal.

FIGS. 2 and 3 illustrate a sharp disturbance signal 5 at T1. Over time, the disturbance signal is reduced to zero.

Figure 7:
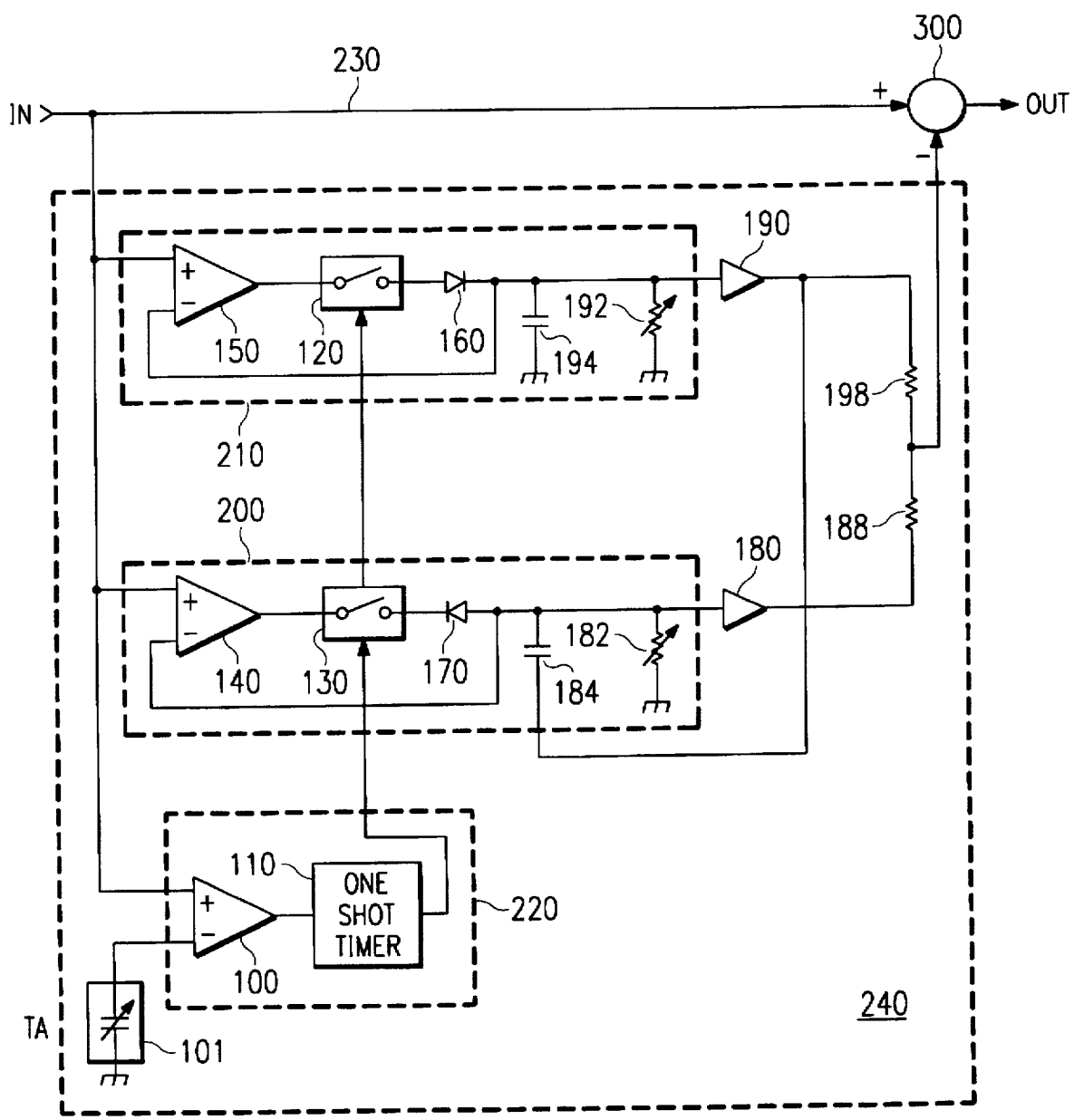
FIG. 7 illustrates a circuit in accordance with the present invention.

FIG. 7 illustrates that a main signal path 230 is to transmit the input signal and that the positive envelope detector 210 is to detect a positive envelope of the information signal 2 and to generate a positive detector signal in response to the positive envelope signal 2, which is coupled to buffer 190. The negative envelope detector 200 detects the negative envelope of the information signal 2 and generates a negative detector signal in response to negative envelope, which is coupled to the amplifier 180. The buffer 190 is coupled to resistor 196. The buffer 180 is coupled to resistor 186, which is coupled to the resistor 196 and summer 300 to sum and subtract the input signal.

FIG. 7 illustrates that a switchable signal path or forward loop 240 may be switched in and out from the main signal path 230 by the control circuit 220. A control circuit 220 is coupled to the positive envelope detector 210 and the negative envelope detector 200 to control the operation of the positive envelope detector 210 and the negative envelope detector 200. The control circuit 220 may include a comparator 100 to compare a threshold voltage with the input signal 6 and a timer circuit 110 to provide a timed control of the forward loop.

The positive envelope detector 210 may include a comparator 150 to compare the input signal 6 with the positive detector signal, a positive switch 120 to switch the output of the comparator 150 and a diode 160 to rectify the output, namely the positive compare signal of comparator 150.

The negative envelope detector 200 may include a comparator 140 to compare the input signal with the negative detector signal, a switch 130 to switch the output of the comparator 140 and a diode 170 to rectify the output of the comparator 140.

Figure 4:
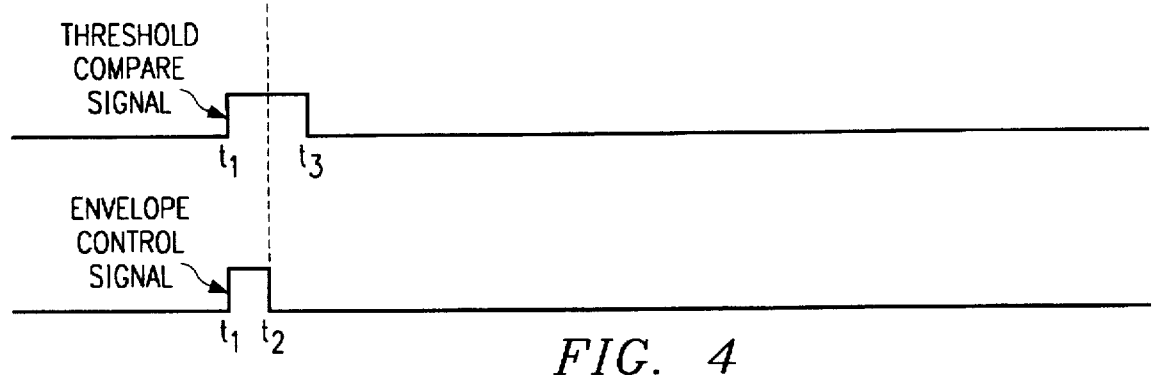
FIG. 4 illustrates the input and output signal of a control circuit to control switches.
Figure 8:
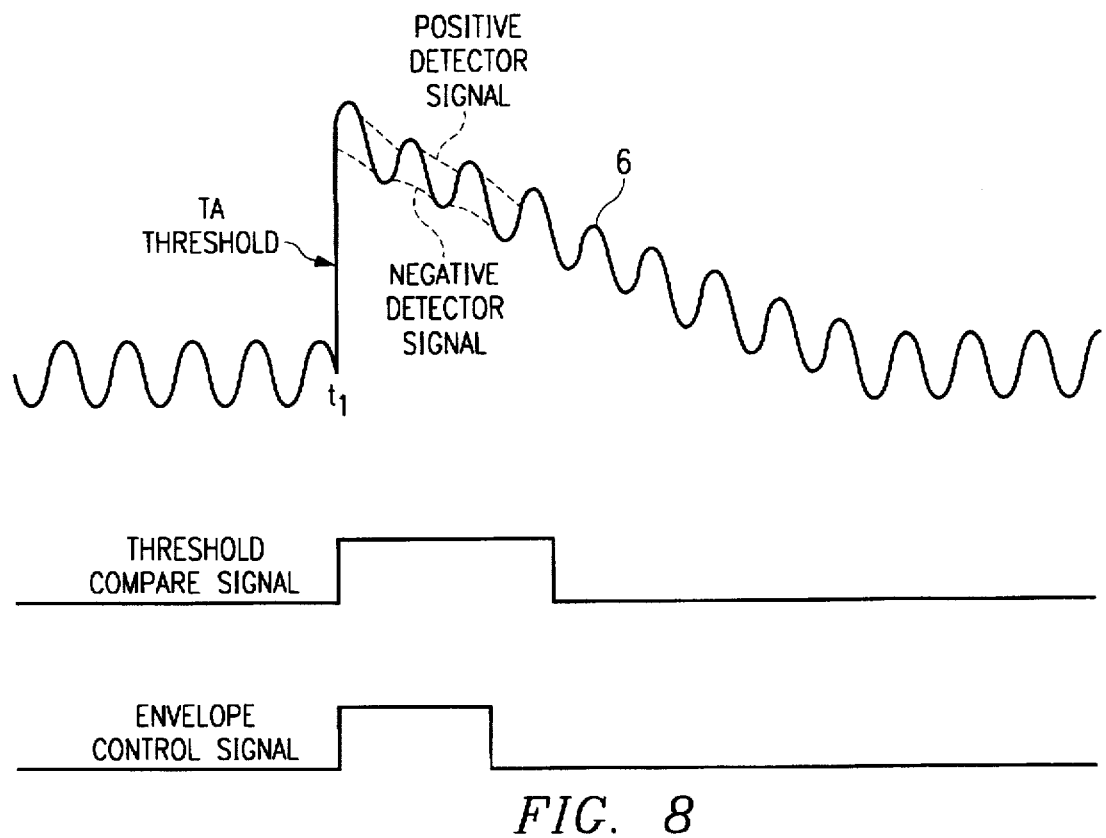
FIG. 8 illustrates a waveform of the positive envelope generator and the negative envelope generator.

The input signal 6, as illustrated in FIG. 3, is input to comparator 100, comparator 140 and comparator 150, simultaneously. Additionally, input to comparator 100 is a reference voltage source 101, set at threshold voltage TA, to provide as a threshold voltage. Normally, this threshold voltage may be set at 20% over the peak of the information signal 2. The comparator 100 compares the threshold voltage with the input signal and outputs a threshold compare signal, such as illustrated in FIG. 4, when the sharp disturbance signal causes the input signal 6 to rise above the threshold voltage. The threshold compare signal is input to the one shot timer 110, and the one shot timer 110 outputs an envelope control signal, such as illustrated in FIGS. 4 and 8. The envelope control signal, which may be a shorter time period than the threshold compare signal controls the positive switch 120 of the positive envelope detector 210 and the negative switch 130 of the negative envelope detector 200.

The positive envelope detector 210 may also include capacitor 194 and variable resistor 192. A positive detector signal is formed at the connection of capacitor 194 and variable resistor 192 in response to the output of positive envelope detector 210.

The negative envelope detector 200 may also include capacitor 184 which may be coupled to the output of buffer 190 and variable resistor 182. A negative detector signal is formed at the connection of capacitor 184 and variable resistor 182 in response to the output of the negative envelope detector 200.

The RC constant of capacitor 194 and variable resistor 192 may be 1.5 microseconds (µs) while the RC constant of capacitor 184 and variable resistor 182 may be larger than 1.5 µs.

Figure 5:
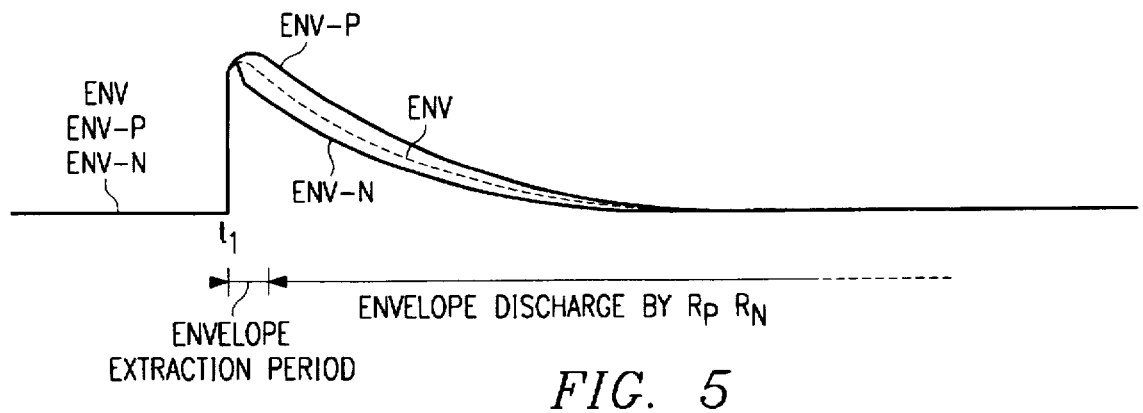
FIG. 5 illustrates a positive and negative envelope, as an output from the positive envelope generator and the negative envelope generator with a first time constant.

FIG. 5 illustrates a RC time constant that matches the time constant of the disturbance signal 4. However, the RC time constant is programmable so that this match can be maintained inspite of changes in the time constant of the disturbance signal, due to head material or dimensional shape, among other things.

One way the programming is achieved is by changing the value of R by a variable resistor.

Figure 6:
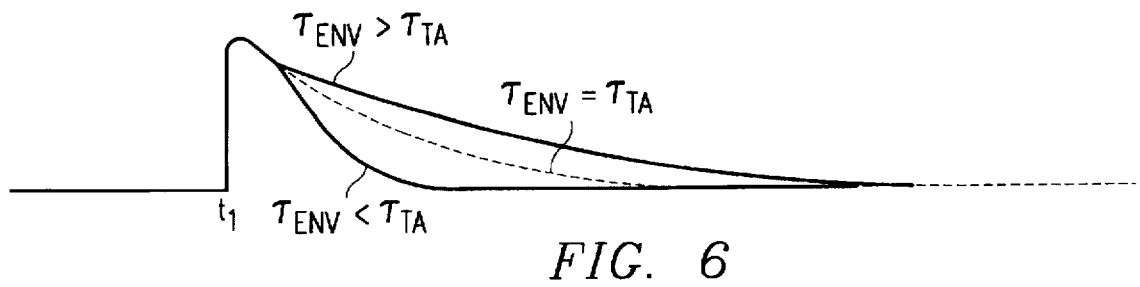
FIG. 6 illustrates the positive and negative envelope as in FIG. 5, but with a second (different) time constant.

FIG. 6 illustrates time constants which are shorter, for example, $T_{EWV} < T_{TA}$ or longer $T_{EWV} > T_{TA}$ than the time constant of the disturbance signal 4.

The input signal 6 is input to the comparator 140 and the comparator 150. Additionally, the negative detector signal is input to comparator 140. The positive detector signal is input to comparator 150. The comparator 140 outputs a negative compare signal based upon a difference between the input signal and the negative detector signal. The comparator 150 outputs the positive compare signal based upon the difference between the input signal and the positive detector signal. When the switch 130 is energized by the envelope control signal the negative compare signal is input to the diode 170 through capacitor 184. The negative detector signal is input to the diode 170. The negative compare signal is a negative signal which tends to be transmitted through diode 170 to charge capacitor 184, in accordance with a resistor 182, which is parallel to capacitor 184.

As switch 120 is energized by the envelope control signal and there is a difference between the inputs of comparators 150, a positive compare signal is output to diode 160. This positive compare signal charges capacitor 194, which is connected in parallel to resistor 192. The voltage at the output of diode 160 is the positive detector signal, which is amplified (gain=1) by buffer 190 and combined with the output of amplifier 180 which amplifies the negative detector signal. The output of the amplifier 190 is the positive envelope signal, while the output of the amplifier 180 is the negative envelope signal. The positive envelope signal and the negative envelope signal are combined to be summed by summer 300. The sum of the positive envelope signal and the negative envelope signal is subtracted by the summer 300 from the input signal 6 to produce the output signal.

In operation, when the input signal 6 consists only of the information signal 2, the input signal 6 is input to comparator 100 is initially insufficient to exceed the threshold voltage TA and consequently, the threshold compare signal remains at zero, which in turn keeps the positive switch 120 and the negative switch 130 open. Thus, both the positive envelope signal and the negative envelope signal are zero, and the input signal 6 is unaffected by the operation of the summer 300. Thus, the outputs of summer 300 is the input signal 6.

However, as a disturbance occurs with the MR sensor a sharp disturbance signal 5 exceeds the threshold voltage; as a result, the comparator 100 outputs a threshold compare signal, for example, a positive pulse, as illustrated in FIG. 4, to the one shot timer 110. One shot timer 110 outputs an envelope control signal as illustrated in FIG. 4, to the positive switch 120 and the negative switch 130. Both the positive switch 120 and the negative switch 130 closes, connecting the comparator 150 with the diode 160, and connecting the comparator 140 with the diode 170. Initially, the positive detector signal at the input at buffer 190 is zero, and the negative detector signal at the input to the buffer 180 is zero. The positive pulses of the information signal 2 are compared with the positive detector signal, and a positive compare signal is produced when the positive pulses of the input signal is greater than the positive detector signal. This positive compare signal is input to diode 160 which outputs the positive compare signal to the positive envelope generator capacitor 194 and resistor 192 to perform the positive detector signal. The positive detector signal is amplified by amplifier 192 to form the positive envelope signal.

In a similar fashion, the negative pulses of the information signal 2 are compared to the negative detector signal. The comparator 140 compares the negative pulses of the information signal with the negative detection signal and outputs a negative comparator signal (a negative signal) when the negative pulses of the input signal are greater (more negative) than the negative detection signal. These negative comparator signals result in diode 170, conducting to produce a negative detector signal across the parallel connection of capacitor 184 and resistor 182. After a positive pulse, the output of buffer 190 is the positive envelope signal. This signal charges capacitor 184 to the positive envelope signal. When the switch 130 closes the capacitor 184 discharges across the diode 130 to the negative detector signal, which corresponds to the negative pulse. The negative detector signal is illustrated in FIG. 8, and is amplified by buffer 180 to form the negative envelope signal. The negative envelope signal is summed with the positive envelope signal and this sum is subtracted from the input signal at summer 300. The one shot timer 100 ends the envelope control signal at T2 which opens positive switch 120 and negative switch 130.

While the invention has been described above with the described modification, it shall be understood that various changes may be made. The invention is not be limited, except as specified in the claims.

What is claimed:

1. A circuit for suppressing an additive transient disturbance in an input signal, comprising:
   a main signal path for transmitting the input signal;
   a switchable signal path being switchably connected to said main signal path comprising:
   a positive envelope detector to detect a positive envelope of said input signal;
   a negative envelope detector to detect a negative envelope of said input signal;
   a control circuit to connect at least one of said positive envelope detector or said negative envelope detector to said main signal path for only a predetermined period of time.

2. A circuit for suppressing an additive transient disturbance in an input signal, as in claim 1, wherein said control circuit connects both of said positive envelope detector and said negative envelope detector to said main signal path for only a predetermined period of time.

3. A circuit for suppressing an additive transient disturbance in an input signal, as in claim 1, wherein said control circuit is activated when said additive transient disturbance exceeds a threshold voltage.

4. A circuit for suppressing an additive transient disturbance in an input signal, as in claim 1, wherein said positive disturbance detector includes a positive generator circuit to generate a positive detector signal based on the positive pulse of said input signal.

5. A circuit for suppressing an additive transient disturbance in an input signal, as in claim 1, wherein said negative envelope detector circuit includes a negative generator circuit to generate a negative detection signal based on said input signal.

6. A method for suppressing an additive transient disturbance in an input signal, comprising the steps of:
   forming a main signal path for transmitting the input signal; and
   switching a switchable signal path to connect to said main signal path only during said additive transient disturbance.

7. A method for suppressing an additive transient disturbance in an input signal, as in claim 6, wherein said method step of switching includes the step of switching at least one of a positive envelope detector or a negative envelope detector.

8. A method for suppressing an additive transient disturbance in an input signal, as in claim 6, wherein said method step of switching includes the step of switching both a positive envelope detector and a negative envelope detector.

9. A method for suppressing an additive transient disturbance in an input signal, as in claim 6, wherein said method step of switching includes the step of detecting when the additive transient disturbance exceeds a threshold voltage.

* * * * *